United States Patent
Ching et al.

(10) Patent No.: US 11,972,981 B2
(45) Date of Patent: Apr. 30, 2024

(54) FinFET CHANNEL ON OXIDE STRUCTURES AND RELATED METHODS

(71) Applicant: Taiwan Semiconductor Manufacturing Company, Ltd., Hsinchu (TW)

(72) Inventors: Kuo-Cheng Ching, Hsinchu County (TW); Ching-Wei Tsai, Hsinchu (TW); Ying-Keung Leung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 139 days.

(21) Appl. No.: 17/807,645

(22) Filed: Jun. 17, 2022

(65) Prior Publication Data

US 2022/0319929 A1 Oct. 6, 2022

Related U.S. Application Data

(60) Division of application No. 16/726,518, filed on Dec. 24, 2019, now Pat. No. 11,367,659, which is a
(Continued)

(51) Int. Cl.
*H01L 21/8234* (2006.01)
*H01L 27/088* (2006.01)
(Continued)

(52) U.S. Cl.
CPC ........... *H01L 21/823412* (2013.01); *H01L 21/823431* (2013.01); *H01L 21/823468* (2013.01);
(Continued)

(58) Field of Classification Search
CPC .... H01L 21/8234; H01L 27/088; H01L 29/00
See application file for complete search history.

(56) References Cited

U.S. PATENT DOCUMENTS

| 7,687,368 B2 | 3/2010 | Kawasaki et al. |
| 8,237,226 B2 | 8/2012 | Okano |
(Continued)

FOREIGN PATENT DOCUMENTS

| CN | 104681613 A | 6/2015 |
| KR | 20140103828 A | 8/2014 |

OTHER PUBLICATIONS

Bart Van Zeghbroeck, "Principles of Semiconductor Devices", Ch. 2: Semiconductor Fundamentals, http://ecee.colorado.edu/~bart/book/book/chapter2/ch2_7.htm, Boulder, CO, 2007.

*Primary Examiner* — Marvin Payen
(74) *Attorney, Agent, or Firm* — Haynes and Boone, LLP

(57) ABSTRACT

A method for fabricating a semiconductor device having a substantially undoped channel region includes forming a plurality of fins extending from a substrate. In various embodiments, each of the plurality of fins includes a portion of a substrate, a portion of a first epitaxial layer on the portion of the substrate, and a portion of a second epitaxial layer on the portion of the first epitaxial layer. The portion of the first epitaxial layer of each of the plurality of fins is oxidized, and a liner layer is formed over each of the plurality of fins. Recessed isolation regions are then formed adjacent to the liner layer. The liner layer may then be etched to expose a residual material portion (e.g., Ge residue) adjacent to a bottom surface of the portion of the second epitaxial layer of each of the plurality of fins, and the residual material portion is removed.

20 Claims, 16 Drawing Sheets

Related U.S. Application Data continuation of application No. 15/714,557, filed on Sep. 25, 2017, now Pat. No. 10,522,407, which is a division of application No. 14/788,300, filed on Jun. 30, 2015, now Pat. No. 9,773,705.

(51) Int. Cl.
*H01L 29/06* (2006.01)
*H01L 29/16* (2006.01)
*H01L 29/161* (2006.01)
*H01L 29/66* (2006.01)
*H01L 29/78* (2006.01)

(52) U.S. Cl.
CPC .. *H01L 21/823481* (2013.01); *H01L 27/0886* (2013.01); *H01L 29/0653* (2013.01); *H01L 29/16* (2013.01); *H01L 29/161* (2013.01); *H01L 29/66545* (2013.01); *H01L 29/66795* (2013.01); *H01L 29/66818* (2013.01); *H01L 29/7848* (2013.01); *H01L 29/785* (2013.01)

(56) References Cited

U.S. PATENT DOCUMENTS

| | | | |
|---|---|---|---|
| 8,487,378 | B2 | 7/2013 | Goto et al. |
| 8,729,634 | B2 | 5/2014 | Shen |
| 8,826,213 | B1 | 9/2014 | Ho |
| 8,859,389 | B2 | 10/2014 | Kawasaki |
| 8,887,106 | B2 | 11/2014 | Ho et al. |
| 8,895,446 | B2 | 11/2014 | Peng et al. |
| 9,035,277 | B2 | 5/2015 | Ching et al. |
| 9,159,833 | B2 | 10/2015 | Ching et al. |
| 9,202,917 | B2 | 12/2015 | Ching et al. |
| 9,559,181 | B2 | 1/2017 | Ching et al. |
| 2014/0203334 | A1 | 7/2014 | Colinge et al. |
| 2014/0282326 | A1 | 9/2014 | Chen et al. |
| 2015/0028426 | A1 | 1/2015 | Chang et al. |

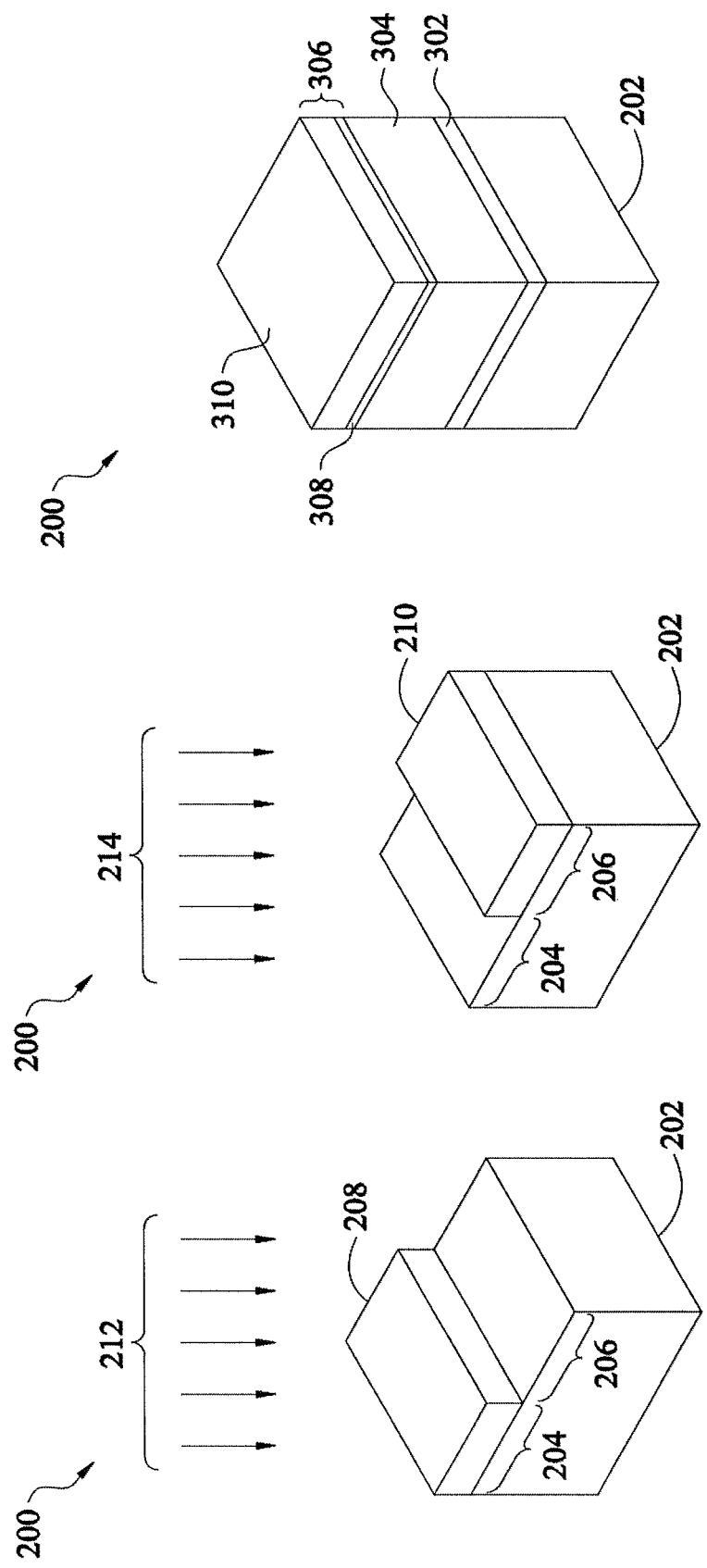

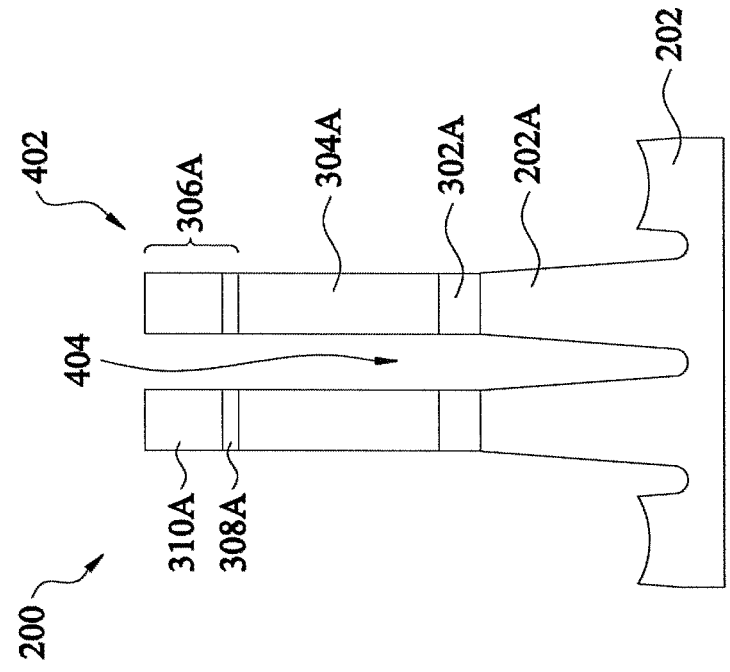
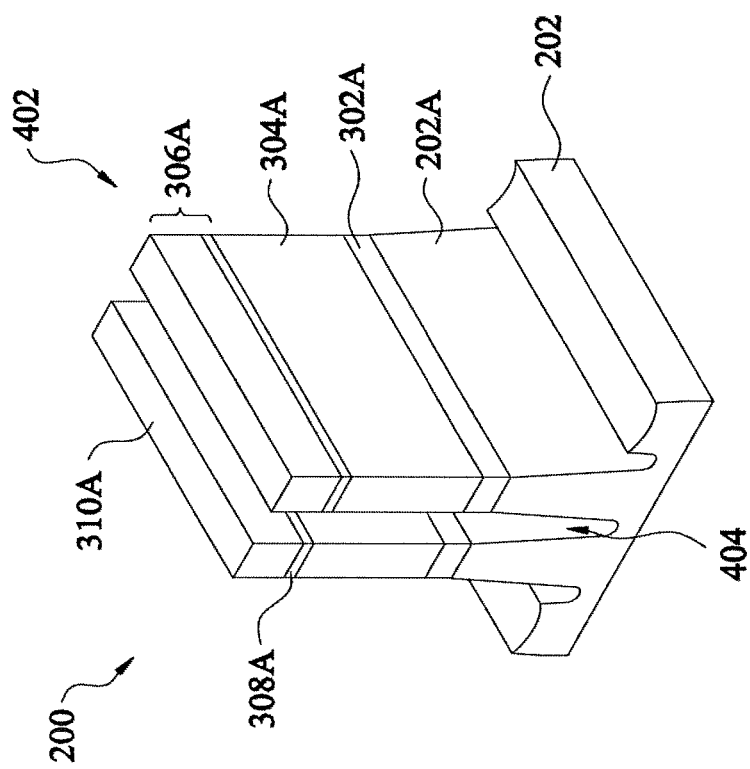
FIG. 4A
FIG. 4B

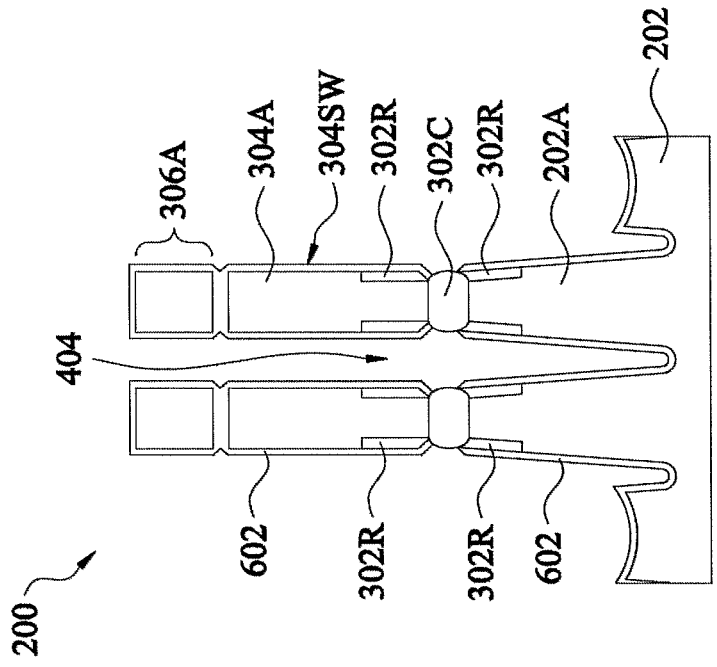
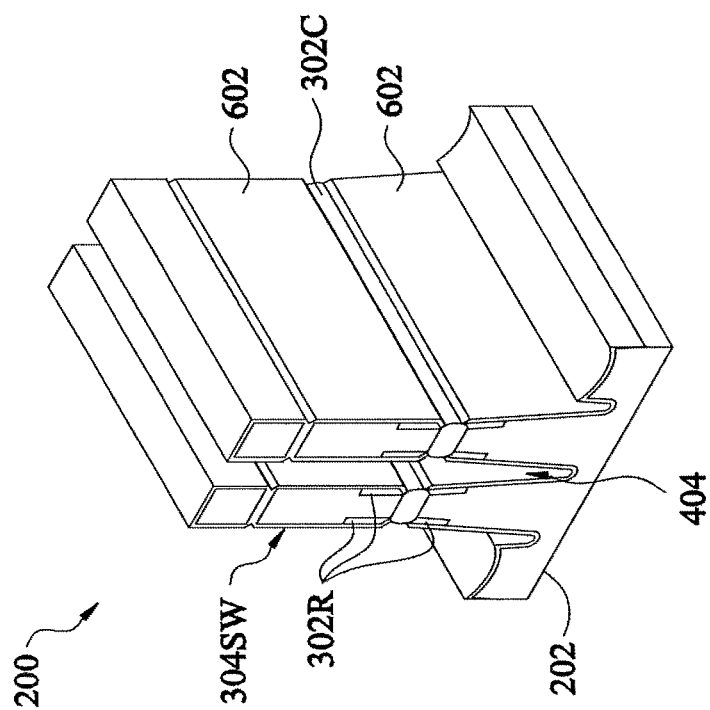
FIG. 6B
FIG. 6A

FinFET CHANNEL ON OXIDE STRUCTURES AND RELATED METHODS

PRIORITY DATA

The present application is a division of U.S. patent application Ser. No. 16/726,518, filed Dec. 24, 2019, issuing as U.S. Pat. No. 11,367,659, which is a continuation of U.S. patent application Ser. No. 15/714,557, filed Sep. 25, 2017, now U.S. Pat. No. 10,522,407, which is a division of U.S. patent application Ser. No. 14/788,300, filed Jun. 30, 2015, now U.S. Pat. No. 9,773,705, entitled "FINFET CHANNEL ON OXIDE STRUCTURES AND RELATED METHODS", the disclosures of which are herein incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In conventional processes, an anti-punch through (APT) ion implantation is performed through FinFET fin elements to prevent punch through of FinFET source/drain depletion regions. However, ion implantation of dopants (e.g., dopants used for APT implants) through fins of FinFET devices directly contributes to the formation of defects and the introduction of impurities in a FinFET channel region. Such channel defects and impurities can cause scattering of carriers flowing through the FinFET channel, thus degrading channel mobility and adversely affecting device performance. Dopant implantation through FinFET fins may also result in a non-uniform doping profile, which among other issues can cause variability of FinFET device parameters. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3, 4A, 5A, 6A, 7A, 8, 9, 10A, 11A, 12A, 13A, and 14-18 are isometric views of an embodiment of a device 200 according to aspects of the method of FIG. 1; and FIGS. 2B, 4B, 5B, 6B, 7B, 10B, 11B, 12B, and 13B are cross-section views, corresponding to respective isometric views listed above, of an embodiment of the device 200 according to aspects of the method of FIG. 1.

DETAILED DESCRIPTION

Figure 1:
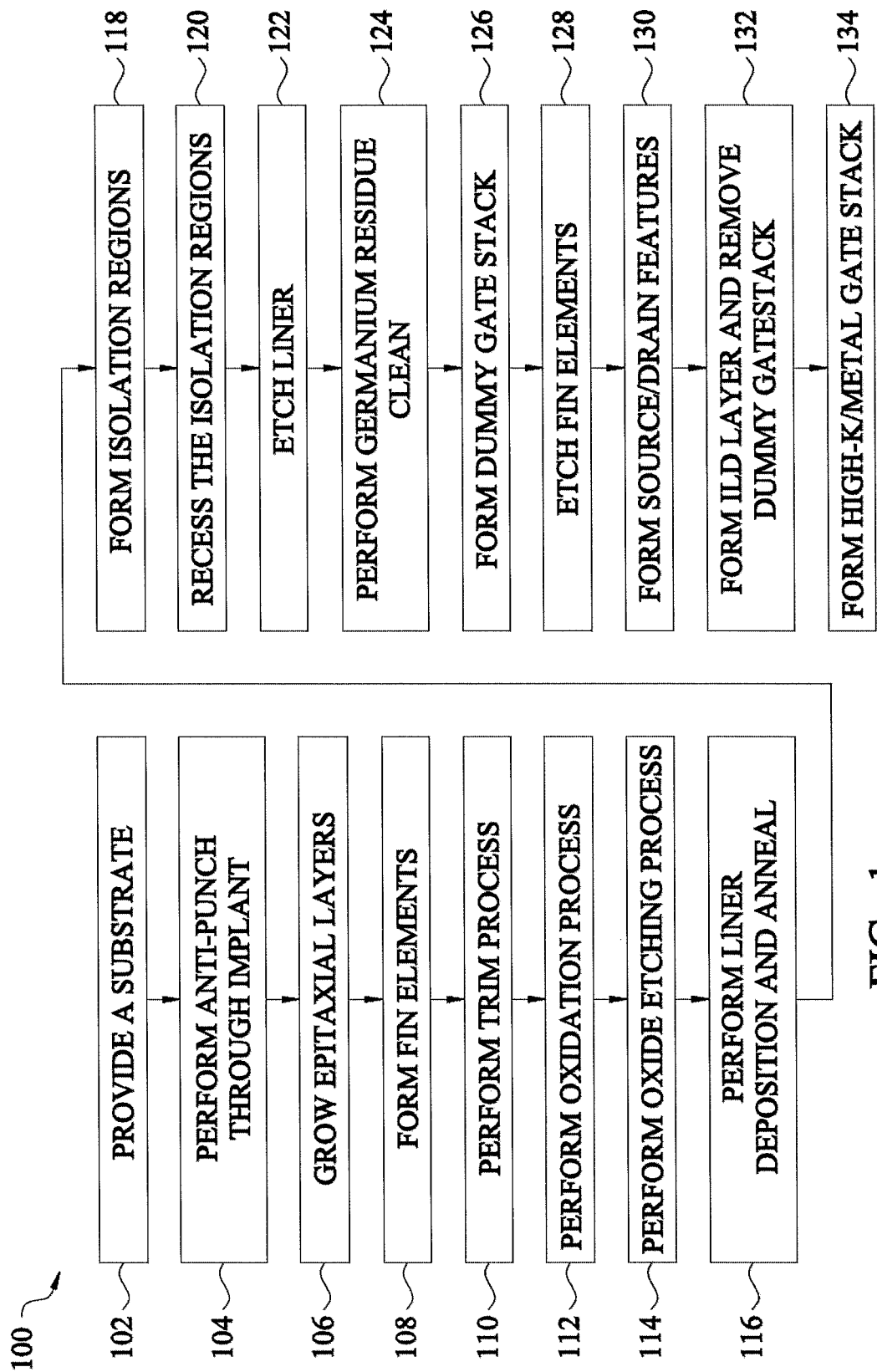
FIG. 1 is a flow chart of a method of fabricating a FinFET device or portion thereof according to one or more aspects of the present disclosure.
Figure 5B:
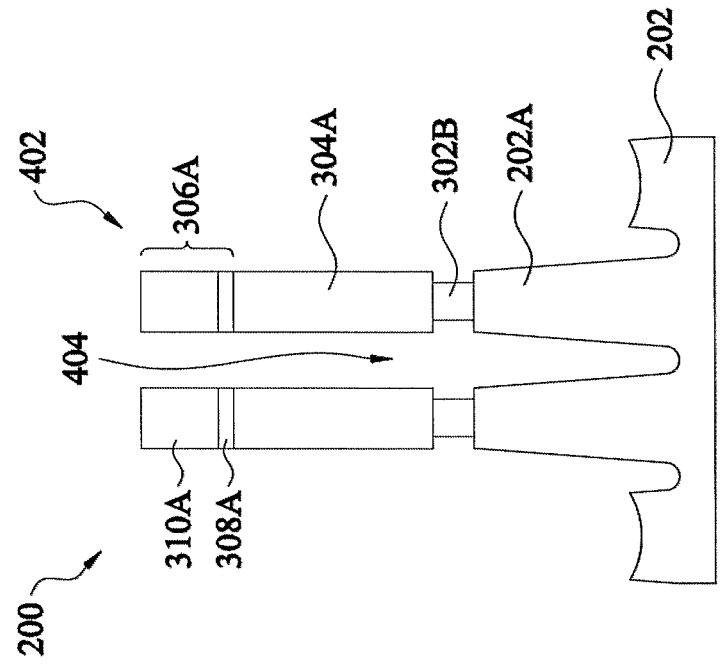
Figure 5A:
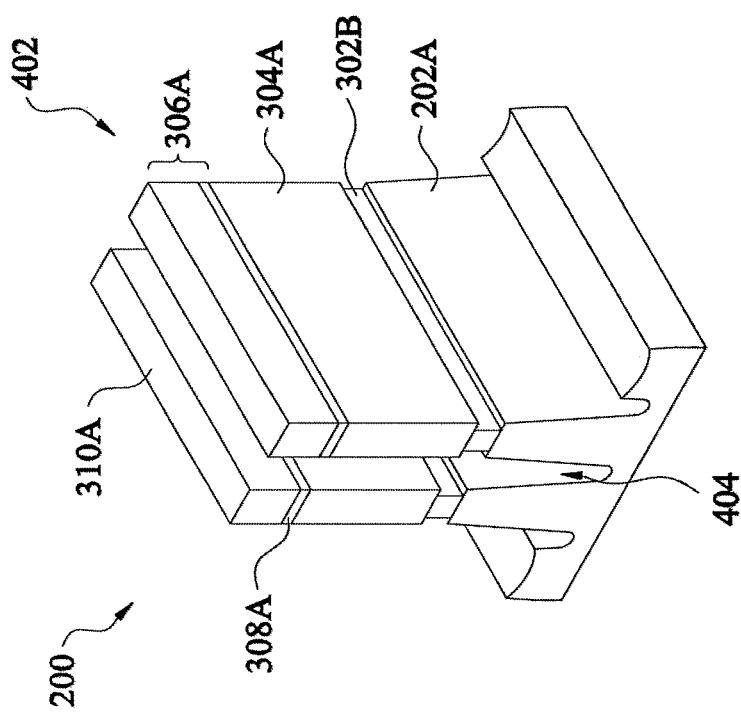

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a method 100 of semiconductor fabrication including fabrication of fins having dopant-free channels disposed on a substrate. As used herein, the term "dopant-free" material is used to describe a material (e.g., a semiconductor material) having an extrinsic dopant concentration from about 0 cm$^{-3}$ to about $1 \times 10^{17}$ cm$^{-3}$. In some examples, as used herein, the term "undoped" may be used interchangeably with "dopant-free", having a similar meaning. In addition, in some embodiments, the terms "undoped" and "dopant-free", as used herein, may refer to substrate regions, fin regions, or other regions that are not purposefully doped (e.g., by an ion implantation process, diffusion process, or other doping process). As discussed below, the presence of dopants in a device channel may cause carrier scattering in the active device channel, which can substantially degrade device performance. Devices, such as FinFET devices, having a substantially dopant-free epitaxially grown undoped channel region, as described below, may result in significantly improved device performance (e.g., increased device ON-current). A "dopant" or "extrinsic dopant", as used herein, is used to describe an impurity (e.g., B, P, As, etc.) that can be introduced into a semiconductor lattice for the purpose of changing the electrical properties of the semiconductor. For example, N-type impurities may be introduced into a semiconductor to form an N-type material, and P-type impurities may be introduced into a semiconductor to form a P-type material. It is understood that the method 100 includes steps having features of a complementary metal-oxide-semiconductor (CMOS) technology process flow and thus, are only described briefly herein. Additional steps may be performed before, after, and/or during the method 100.

FIGS. 2A, 3, 4A, 5A, 6A, 7A, 8, 9, 10A, 11A, 12A, 13A, and 14-18 are isometric views of an embodiment of a semiconductor device 200 according to various stages of the method 100 of FIG. 1. FIGS. 2B, 4B, 5B, 6B, 7B, 10B, 11B, 12B, and 13B are cross-section views, corresponding to respective isometric views listed above, of an embodiment of the semiconductor device 200 according to various stages of the method 100 of FIG. 1. It is understood that parts of the semiconductor device 200 may be fabricated by a CMOS technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to FIGS. 2-18, are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

The method 100 then proceeds to block 104 where an APT implant is performed. Referring to the example of FIGS. 2A and 2B, an embodiment of block 104 is shown. In some embodiments, a first photolithography (photo) step is performed to pattern a P-type APT region 206 and a second photo step is performed to pattern an N-type APT region 204. For example, in some embodiments, performing the first photo step may include forming a photoresist layer (resist) over the substrate 202, exposing the resist to a pattern (e.g., P-type APT implant mask), performing post-exposure bake processes, and developing the resist to form a patterned resist layer 208. As shown in FIG. 2A, after formation of the patterned resist layer 208, an ion implantation process 212 is performed into the P-type APT region 206 of the substrate 202, while the N-type APT region 204 remains masked by the resist layer 208. By way of example, a P-type dopant implanted via the ion implantation process 212 into the P-type APT region 206 may include boron, aluminum, gallium, indium, or other P-type acceptor material. After the ion implantation process 212, the resist layer 208 may be removed, for example, by way of a solvent, resist stripper, ashing, or other suitable technique. Thereafter, in some embodiments, the second photo step may be performed, where the second photo step may include forming a resist layer over the substrate 202, exposing the resist to a pattern (e.g., N-type APT implant mask), performing post-exposure bake processes, and developing the resist to form a patterned resist layer 210. As shown in FIG. 2B, after formation of the patterned resist layer 210, an ion implantation process 214 is performed into the N-type APT region 204 of the substrate 202, while the P-type APT region 206 remains masked by the resist layer 210. By way of example, an N-type dopant implanted via the ion implantation process 214 into the N-type APT region 204 may include arsenic, phosphorous, antimony, or other N-type donor material. After the ion implantation process 214, the resist layer 210 may be removed, for example, by way of a solvent, resist stripper, ashing, or other suitable technique. It will be understood that the first and second photo steps may be performed in any order, for example, the N-type APT region 204 may be implanted before the P-type APT region 206. Additionally, in various embodiments, an APT implant may have a high dopant concentration, for example, of between about $1 \times 10^{18}$ cm$^{-3}$ and $1 \times 10^{19}$ cm$^{-3}$. Such a high APT dopant concentration may be advantageously used, as described below, because of the presence of a subsequently formed dielectric layer over the APT-implanted substrate, which serves as a dopant diffusion barrier.

By performing the APT implant processes 212, 214 prior to formation of FinFET fin structures, FinFET fin damage and device degradation can be avoided. For example, in existing semiconductor process flows, ion implantation processes (e.g., APT ion implant processes) are performed through FinFET fin elements, described below, which can result in damage to the fin elements, including damage to a FinFET channel region, which can lead to carrier scattering and thus degrade device performance. Although a high temperature anneal may be used in an attempt to remove such defects (as well as for dopant activation), all defects introduced by ion implantation may not be removed and the substrate (or fin elements) may thus not be fully restored to its pre-ion implant condition. In addition, dopant implantation through FinFET fin elements may result in a non-uniform doping profile that includes dopants distributed within the FinFET channel region. As known in the art, increased doping concentrations in a device channel can lead to decreased device mobility due to ionized impurity scattering.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for avoiding degradation to semiconductor devices that can occur due to ion implantation processes, such as APT ion implantation processes, including defect formation and the introduction of channel impurities. In some embodiments, an N-type APT region 204 and/or P-type APT region 206 are implanted, as described above, prior to formation of FinFET fin elements, as described below. Thus, APT ion implant induced degradation is avoided. In some embodiments, an epitaxially grown undoped channel layer is formed over the APT-implanted substrate, as described below. Moreover, in various embodiments, the epitaxially grown undoped channel layer is separated from the APT-implanted substrate by an oxide layer, which serves as a diffusion barrier to APT dopants. Because of this advantageous oxide barrier layer, the APT implant may have a high dopant concentration, for example, of between about $1 \times 10^{18}$ cm$^{-3}$ and $1 \times 10^{19}$ cm$^{-3}$. In some embodiments, because the epitaxially grown undoped channel layer is substantially free of dopants, carrier channel scattering is mitigated, and device mobility and drive current are improved. In various embodiments, the undoped channel layer (and thus the active device channel) has a dopant concentration of less than about $1 \times 10^{17}$ cm$^{-3}$. In some processes which include an oxidized SiGe layer as the diffusion barrier, the SiGe layer may not be fully oxidized, resulting in Ge residue which can be detrimental to device performance. Thus, embodiments of the present disclosure further provide methods for fully oxidizing the SiGe layer, as well as reducing and/or eliminating such Ge residue without a penalty on a FinFET height or width, as described below. In addition, it is noted that the methods and structures described herein may be applied to NFET or PFET devices. Further, while the discussion herein is directly primarily to FinFET devices, one of ordinary skill in the art in possession of this disclosure will appreciate that the methods and structures described herein may be equally applicable to other types of devices without departing from the scope of the present disclosure. Moreover, other embodiments and advantages will be evident to those skilled in the art upon reading the present disclosure.

Returning to FIG. 1, the method 100 then proceeds to block 106 where one or more epitaxial layers are grown. With reference to the example of FIG. 3, in an embodiment of block 106, an epitaxial layer 302 is formed over the APT-implanted substrate 202, and an epitaxial layer 304 is formed over the epitaxial layer 302. In some embodiments, the epitaxial layer 302 has a thickness range of about 2-10 nm. In some embodiments, the epitaxial layer 304 has a thickness range of about 30-60 nm. By way of example, epitaxial growth of the layers 302, 304 may be performed by a molecular beam epitaxy (MBE) process, a metalorganic chemical vapor deposition (MOCVD) process, and/or other suitable epitaxial growth process. In some embodiments, the epitaxially grown layers 302, 304 include the same material as the substrate 202. In some embodiments, the epitaxially grown layers 302, 304 include a different material than the substrate 202. In at least some examples, the epitaxial layer 302 includes an epitaxially grown silicon germanium (SiGe) layer and the epitaxial layer 304 includes an epitaxially grown silicon (Si) layer. Alternatively, in some embodiments, either of the epitaxial layers 302, 304 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In various embodiments, the epitaxial layers 302, 304 are substantially dopant-free (i.e., having an extrinsic dopant concentration from about 0 cm$^{-3}$ to about $1 \times 10^{17}$ cm$^{-3}$), where for example, no intentional doping is performed during the epitaxial growth process. As described in more detail below, the epitaxially grown undoped epitaxial layer 304 may serve as a channel region for a subsequently-formed FinFET device. Thus, carrier scattering through the FinFET channel will be substantially reduced for FinFET devices including the substantially dopant-free epitaxially grown undoped epitaxial layer 304 described herein.

In various embodiments the epitaxial layer 302 has a first oxidation rate, and the epitaxial layer 304 has a second oxidation rate less than the first oxidation rate. For example, in embodiments where the epitaxial layer 302 includes SiGe and where the epitaxial layer 304 includes Si, the Si oxidation rate of the epitaxial layer 304 is less than the SiGe oxidation rate of the epitaxial layer 302. During a subsequent oxidation process (after formation of FinFET fin elements), as discussed below, the portions of the fin elements including the epitaxial layer 302 may be fully oxidized, while only sidewalls of fin elements including the epitaxial layer 304 may be oxidized. In some embodiments, the fully oxidized portions of the fin elements including the epitaxial layer 302 serve as a diffusion barrier to APT dopants previously implanted into the substrate 202, for example, so that the APT dopants will not diffuse into a subsequently formed FinFET channel. Also, in some embodiments, the sidewall oxidation of fin elements including the epitaxial layer 304 serves to fine tune a shape of the fin elements which form a FinFET channel.

As also shown in the example of FIG. 3, a hard mask (HM) layer 306 may be formed over the epitaxial layer 304. In some embodiments, the HM layer 306 includes an oxide layer 308 (e.g., a pad oxide layer that may include SiO$_2$) and nitride layer 310 (e.g., a pad nitride layer that may include Si$_3$N$_4$) formed over the oxide layer 308. In some examples, the oxide layer 308 may include thermally grown oxide, CVD-deposited oxide, and/or ALD-deposited oxide, and the nitride layer 310 may include a nitride layer deposited by CVD or other suitable technique. By way of example, the oxide layer 308 may have a thickness of between approximately 5 nm and approximately 40 nm. In some embodiments, the nitride layer 310 may have a thickness of between approximately 20 nm and approximately 160 nm.

The method 100 then proceeds to block 108 where fin elements, used for subsequent FinFET formation, are formed. With reference to the example of FIGS. 4A and 4B, in an embodiment of block 108, a plurality of fin elements 402 extending from the substrate 202 are formed. In various embodiments, each of the fin elements 402 includes a substrate portion 202A formed from the substrate 202, a first epitaxial layer portion 302A formed from the epitaxial layer 302, a second epitaxial layer portion 304A formed from the epitaxial layer 304, and an HM layer portion 306A (including an oxide layer portion 308A and a nitride layer portion 310A) formed from the HM layer 306.

The fins 402, like the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 402 may be fabricated using suitable processes including photolithography and etch processes. The photolithography process may include forming a photoresist layer over the substrate 202 (e.g., over the HM layer 306 of FIG. 3), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers formed thereupon, while an etch process forms trenches 404 in unprotected regions through the HM layer 306, through the epitaxial layers 302, 304, and into the substrate 202, thereby leaving the plurality of extending fins 402. The trenches 404 may be etched using a dry etch (e.g., reactive ion etching), a wet etch, and/or other suitable processes. Numerous other embodiments of methods to form the fins on the substrate may also be used. As described in more detail below, and in some embodiments, the second epitaxial layer portion 304A will serve as a FinFET device channel. Moreover, because the second epitaxial layer portion 304A is undoped, and remains undoped throughout device fabrication as discussed below, the FinFET channel region thus remains substantially free of dopants. Therefore, in accordance with embodiments of the present disclosure, FinFET carrier channel scattering is mitigated, and device mobility and drive current are improved.

As shown in FIGS. 4A and 4B, sidewalls of the fins 402, in particular the second epitaxial layer portion 304A, are substantially vertical. In various embodiments, such a vertical fin profile results in improved FinFET device performance. In some cases, formation of the fins 402 may initially result in fins 402 having a tapered profile. However, in some embodiments, a subsequently performed oxidation process, as described below, may be used to tune the profile of the fins 402 and thus create a more vertical sidewall.

The method 100 then proceeds to block 110 where a trim process is performed. With reference to the example of FIGS. 4A/5A and 4B/5B, in an embodiment of block 110, the first epitaxial layer portion 302A is trimmed to form a trimmed epitaxial layer portion 302B. In various embodiments, formation of the trimmed epitaxial layer portion 302B ensures that the epitaxial layer portion 302B becomes fully oxidized during a subsequent oxidation process, as described below. For example, in embodiments where the epitaxial layer 302 includes SiGe, the trimmed epitaxial layer portion 302B may likewise include SiGe. Thus, during a subsequent oxidation process, such a SiGe trimmed epitaxial layer portion 302B will become fully oxidized. In some embodiments, a trimming process used to form the trimmed epitaxial layer portion 302B includes an etching process such as a wet etching process. By way of example, etchants used for the trimming process may include a mixture of sulfuric acid ($H_2SO_4$) and hydrogen peroxide ($H_2O_2$) (known as a sulfuric peroxide mixture (SPM)), a mixture of ammonium hydroxide ($NH_4OH$), $H_2O_2$, and water ($H_2O$) (known as an ammonia-peroxide mixture (APM)), a mixture of $NH_4OH$ and $H_2O_2$, $H_2O_2$, and/or other etchants as known in the art. Alternatively, in some embodiments, the trimming process may include a dry etching process or a combination of a dry/wet etching process.

The method 100 then proceeds to block 112 where an oxidation process is performed. With reference to the example of FIGS. 5A/6A and 5B/6B, in an embodiment of block 112, the device 200 is exposed to an oxidation process that fully oxidizes the trimmed epitaxial layer portion 302B of each of the plurality of fin elements 402, resulting in oxidized layer 302C. In some embodiments, the oxidized layer 302C (e.g., which may include a SiGe oxide layer) has a thickness range of about 5-20 nm In various embodiments, the oxidation process may also form an oxide layer 602 over one or more of the substrate 202, the substrate portion 202A, the second epitaxial layer portion 304A, and the HM layer portion 306A. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting in any way. As illustrated in FIGS. 6A/6B, the oxidation process may also oxidize sidewalls 304SW of the second epitaxial layer portion 304A (e.g., rather than the entirety of the second epitaxial layer portion 304A). In some embodiments, oxidation of the sidewalls 304SW may provide for tuning of the profile of the fins 402, for example, by reducing and/or otherwise adjusting fin 402 profile tapering which may have been previously present in the fins 402 (e.g., after formation of the fin elements at block 108).

As described above, in some embodiments, the first epitaxial layer portion 302A (and thus the trimmed epitaxial layer portion 302B) may include a material having a first oxidation rate, and the second epitaxial layer portion 304A may include a material having a second oxidation rate less than the first oxidation rate. By way of example, in embodiments where the first epitaxial layer portion 302A (and thus the trimmed epitaxial layer portion 302B) includes SiGe, and where the second epitaxial layer portion 304A includes Si, the faster SiGe oxidation rate (i.e., as compared to Si) ensures that the SiGe layer (i.e., the trimmed epitaxial layer portion 302B) becomes fully oxidized (i.e., oxidized layer 302C) while only a sidewall portion of the Si layer (i.e., the second epitaxial layer portion 304A) is oxidized. It will be understood that any of the plurality of materials discussed above may be selected for each of the first and second epitaxial layer portions 302A, 304A, as long as the oxidation rate of the second epitaxial layer portion 304A is less than the oxidation rate of the first epitaxial layer portion 302A (and thus less than the oxidation rate of the trimmed epitaxial layer portion 302B). In this manner, the fully oxidized layer 302C of each of the fin elements 402 serves as a diffusion barrier to APT dopants previously implanted into the substrate 202, and which may be present in the substrate portion 202A directly below the oxidized layer 302C. Thus, in various embodiments, the oxidized layer 302C serves to prevent APT dopants within the substrate portion 202A from diffusing into the second epitaxial layer portion 304A, which serves as a channel region for a subsequently formed FinFET device. Additionally, in some embodiments, by tuning oxidation of the sidewall 304SW of the second epitaxial layer portion 304A, the profile of the fins 402 may also be tuned. It will further be understood by those skilled in the art that the oxidation process conditions may be chosen so as to tune the fin 402 shape to any of a plurality of profiles as may be desirable for a given device design, process technology, or other process conditions.

Returning to the discussion of oxidation of the trimmed epitaxial layer portion 302B, wherein the trimmed epitaxial layer portion 302 includes SiGe, it is noted that the oxidation of Ge is relatively more difficult as compared to Si within a given layer of SiGe. Thus, during the oxidation process as described above, a portion of material (e.g., Ge) from the trimmed epitaxial layer portion 302B may diffuse into one or both of the second epitaxial layer portion 304A and the substrate portion 202A, resulting in a residual material portion 302R. In various embodiments, the residual material portion 302R includes non-oxidized Ge residue and/or Ge which has been only partially oxidized. In various examples, such residual Ge of the residual material portion 302R (and particularly residual Ge of the residual material portion 302R within the second epitaxial layer portion 304A) may present a reliability concern for subsequently fabricated FinFET devices. Thus, it is desirable to remove the residual Ge of the residual material portion 302R, particularly within the second epitaxial layer portion 304A, as the second epitaxial layer portion 304A will serve as the device channel for a subsequently fabricated device. Thereby, as described below, embodiments of the present disclosure provide methods for removal of such Ge residue, without sacrificing a fin 402 height and/or a fin 402 width, while also serving to improve FinFET device performance.

The method 100 then proceeds to block 114 where an oxide etching process is performed. In an embodiment of block 114, the device 200 may be exposed to an etching process that serves to remove the oxide layer 602 from over the one or more of the substrate 202, the substrate portion 202A, the second epitaxial layer portion 304A (e.g., from the sidewalls 304SW), and the HM layer portion 306A. In some embodiments, the etching process may also remove a portion of the oxidized layer 302C. In some embodiments, the oxide etching process includes an wet etching process, where the etchant used for the wet etching process may include a dilute mixture of hydrofluoric acid (HF) (e.g., 49% HF in $H_2O$ by weight) and de-ionized (DI) $H_2O$, where the $HF:H_2O$ ratio is approximately 1:50, approximately 1:100, or other suitable ratio. Alternatively, in some embodiments, the etching process may include a dry etching process or a combination of a dry/wet etching process.

Figure 7B:
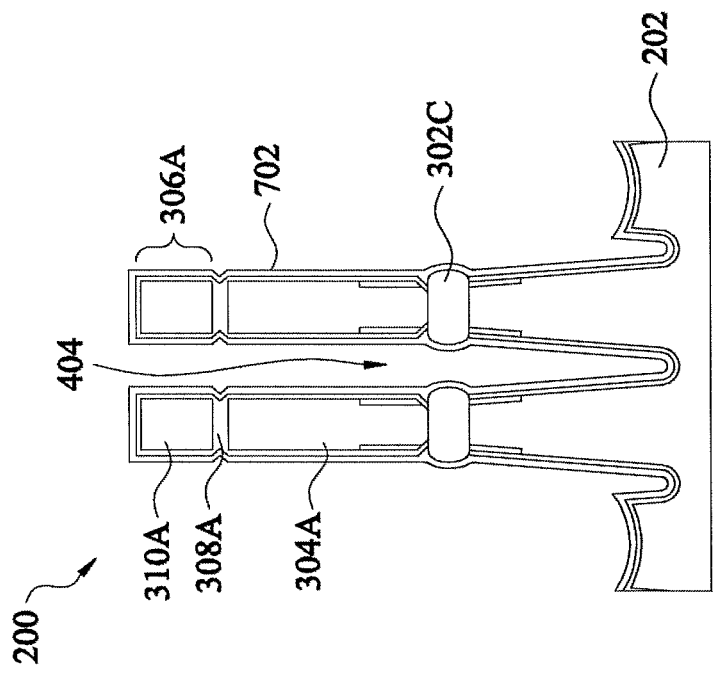
Figure 7A:
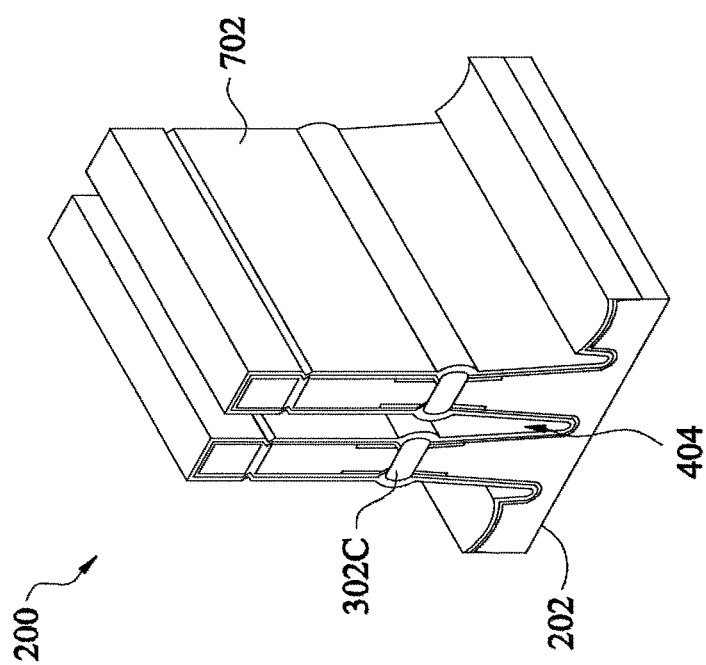

The method 100 then proceeds to block 116 where a liner layer is deposited and annealed. With reference to the example of FIGS. 6A/7A and 6B/7B, after removal of the oxide layer 602 by the oxide etching process of block 114 and in an embodiment of block 116, a liner layer 702 may then be deposited over the device 200 and into the trenches 404. In some embodiments, the liner layer 702 includes silicon nitride deposited by CVD or other suitable technique. In some examples, the liner layer 702 may include another material such as silicon oxynitride, aluminum oxide ($Al_2O_3$), aluminum nitride (AlN), aluminum oxynitride (AlON), and/or other another suitable material as known in the art. In various embodiments, the material selected for the liner layer 702 includes a material that may be readily removed by a wet etching process. In some examples, the material selected for the liner layer 702 includes a material that has an oxygen-blocking capability (e.g., oxygen-blocking during an anneal process). In some embodiments, because the oxide layer 602 was fully removed at block 114, the deposited liner layer 702 may directly contact at least the second epitaxial layer portion 304A, the oxidized layer 302C, and the substrate portion 202A, as shown in FIGS. 7A/7B. By way of example, the liner layer 702 may have a thickness of between approximately 3 nm and approximately 8 nm. In some embodiments, after formation of the liner layer 702, the device 200 may be subjected to an anneal process to remove defects from and improve the quality of the liner layer 702. For example, in some embodiments, the liner layer 702 may be annealed at a temperature from about 750° C.-1050° C. for a time of about 30 s-30 min. In various embodiments, the liner layer may be annealed at a pressure of about 1 ATM, and in some cases, in a nitrogen ($N_2$) ambient.

Figure 9:
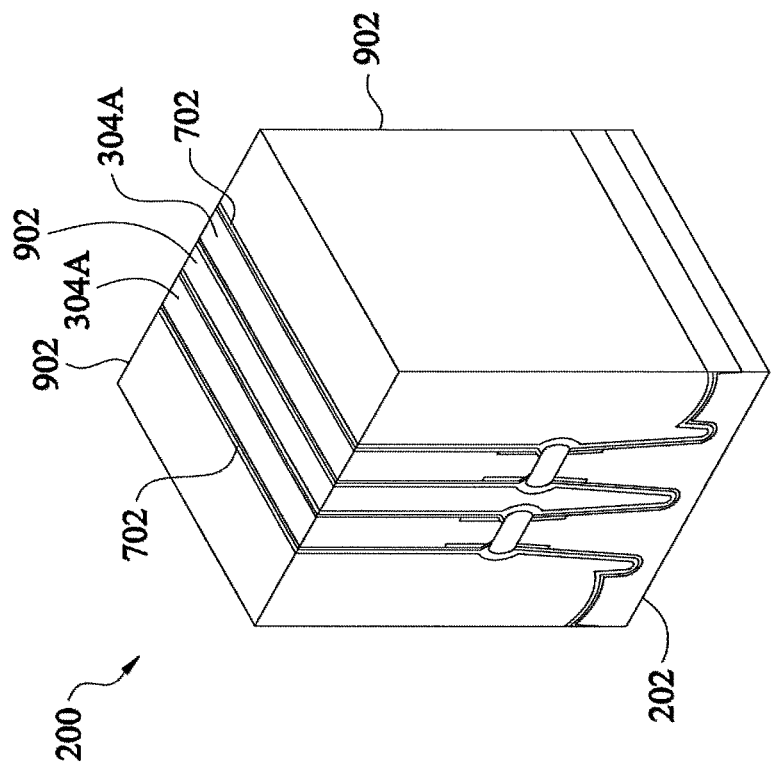

The method 100 then proceeds to block 118 where isolation regions are formed. With reference to the example of FIGS. 7A/7B, 8, and 9, in an embodiment of block 118, a plurality of isolation regions 902 (FIG. 9) are formed. In some embodiments, the plurality of isolation regions 902 may include a plurality of shallow trench isolation (STI) features. By way of example, in some embodiments, a dielectric layer 802 (FIG. 8) is first deposited over the substrate 202, filling the trenches 404 with the dielectric layer 802. In some embodiments, the dielectric layer 802 may include $SiO_2$, silicon nitride, silicon oxynitride, fluorine-doped silicate glass (FSG), a low-k dielectric, combinations thereof, and/or other suitable materials known in the art. In various examples, the dielectric layer 802 may be deposited by a CVD process, a subatmospheric CVD (SACVD) process, a flowable CVD process, an ALD process, a PVD process, or other suitable process. In some embodiments, after deposition of the dielectric layer 802, the device 200 may be annealed to improve the quality of the dielectric layer 802. In some embodiments, a field oxide, a LOCOS feature, and/or other suitable isolation features may additionally or alternatively be implemented on and/or within the substrate. However, other embodiments are possible. For example, in some embodiments, the dielectric layer 802 (and subsequently formed isolation regions 902) may include a multi-layer structure, for example, having one or more liner layers. After deposition of the dielectric layer 802, the deposited dielectric layer 802 is thinned and planarized, for example by a CMP process. With reference to FIG. 9, illustrated therein is the device 200 at an intermediate processing stage where a CMP process has been performed to remove excess material of the dielectric layer 802, planarize a top surface of the device 200, and thereby form the isolation regions 902. In some embodiments, the isolation regions 902 are configured to isolate fin active regions (e.g., the second epitaxial layer portion 304A).

Figure 8:
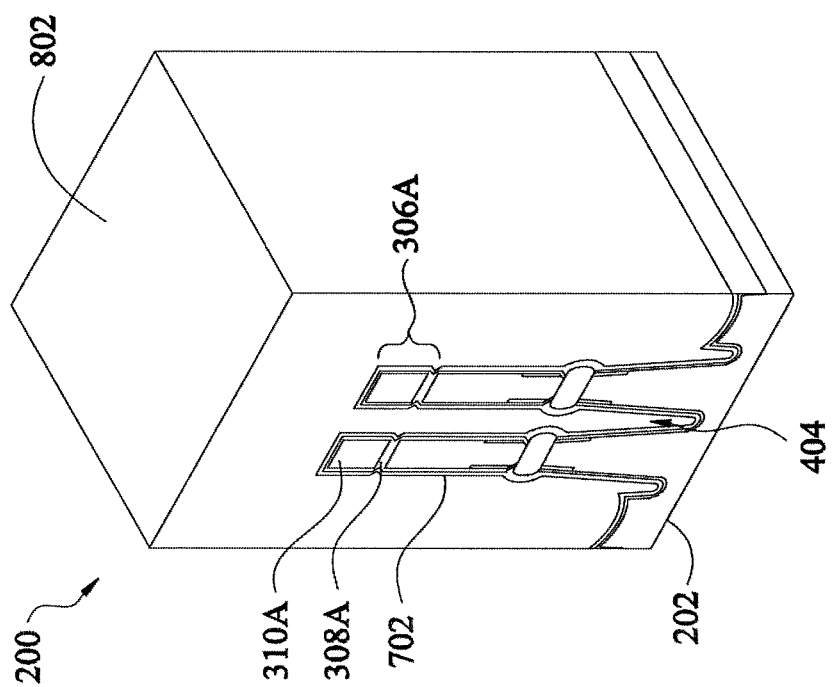

Referring to FIGS. 8 and 9, and in some embodiments, the CMP process used to planarize the top surface of the device 200 and form the isolation regions 902 may also serve to remove the HM layer portion 306A from each of the plurality of fin elements 402. In some embodiments, removal of the HM layer portion 306A includes removal of the oxide layer portion 308A and the nitride layer portion 310A. Removal of the HM layer portion 306A, including the oxide layer portion 308A and the nitride layer portion 310A, may alternately be performed by using a suitable etching process (e.g., dry or wet etching). Whether by using a CMP process or an etching process, upon removal of the HM layer portion 306A from the top of each of the fin elements 402, the underlying second epitaxial layer portion 304A of each of the fin elements 402 is exposed.

The method 100 then proceeds to block 120 where the isolation regions are recessed. Referring to the examples of FIGS. 9 and 10A/10B, in an embodiment of block 120, the isolation regions 902 around the fin elements 402 are recessed to laterally expose an upper portion 402A of the fin elements 402. In some embodiments, the recessing process may include a dry etching process, a wet etching process, and/or a combination thereof. For example, the recessing process may include a dry, plasma-free process using a reaction gas or reaction gas combination, such as $HF+NH_3$, $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some embodiments, the dry, plasma-free recessing process is performed using a SICONI® System, available from Applied Materials, Inc., Santa Clara, CA In some examples, the recessing process may include a wet etch performed using a dilute mixture of HF (e.g., 49% HF in $H_2O$ by weight) and de-ionized (DI) $H_2O$, where the HF:$H_2O$ ratio is approximately 1:50, approximately 1:100, or other suitable ratio.

Figure 10B:
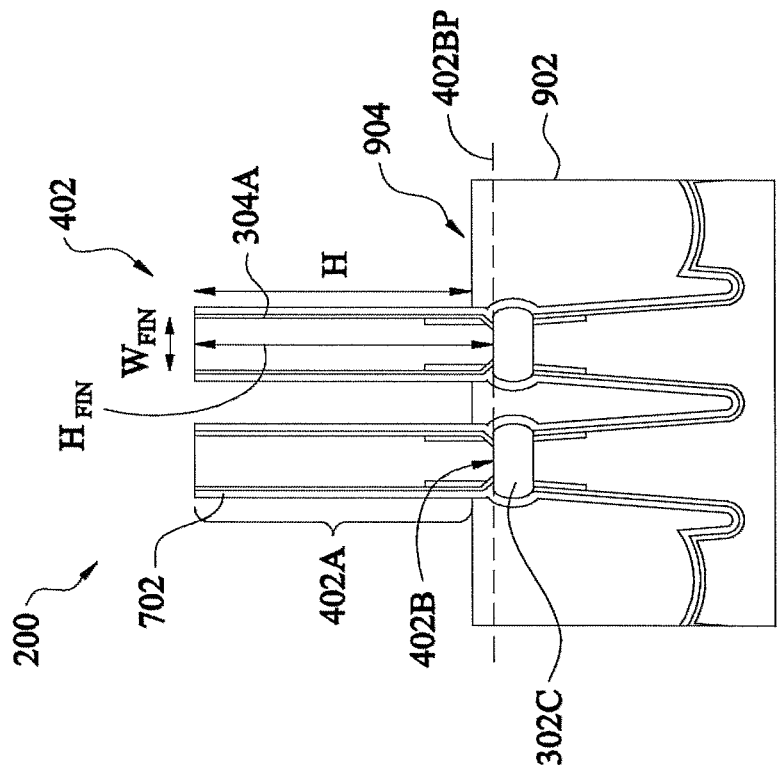
Figure 10A:
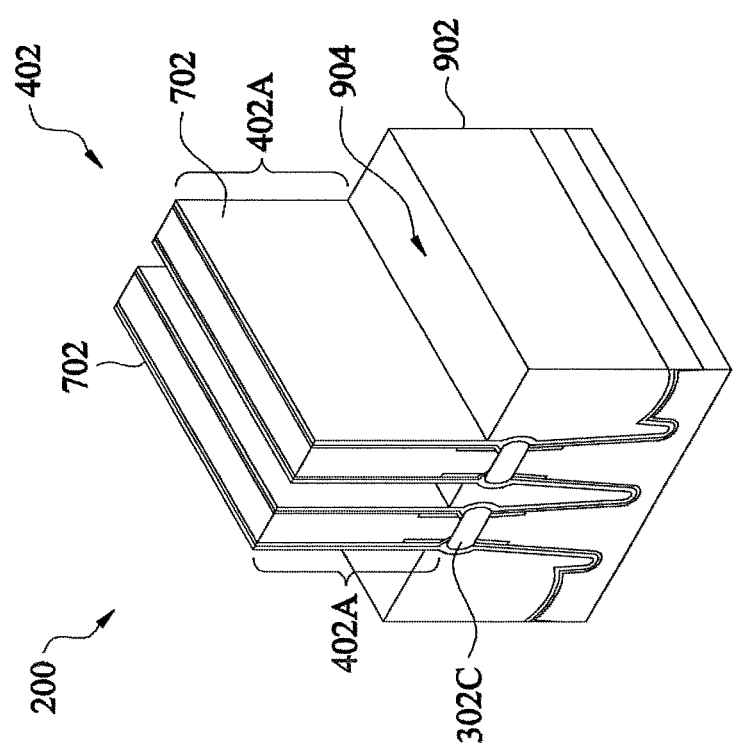
Figure 11B:
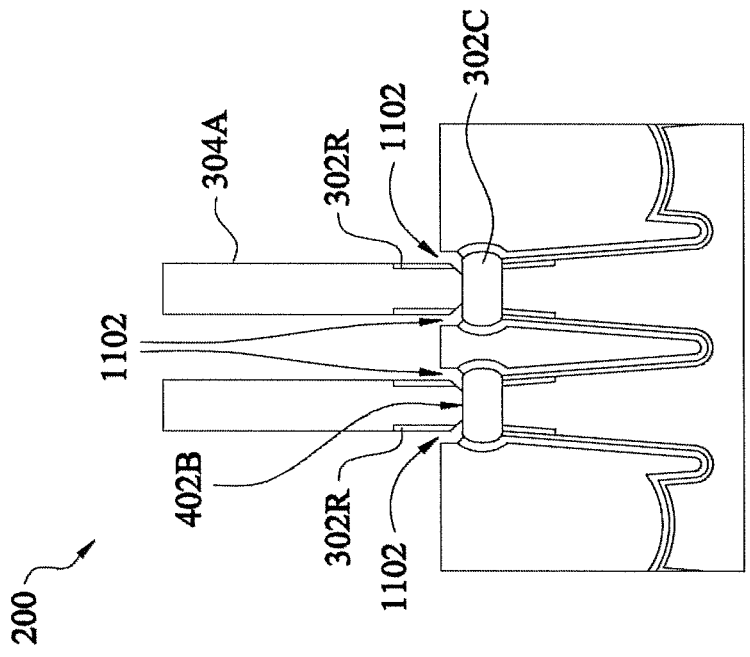
Figure 11A:
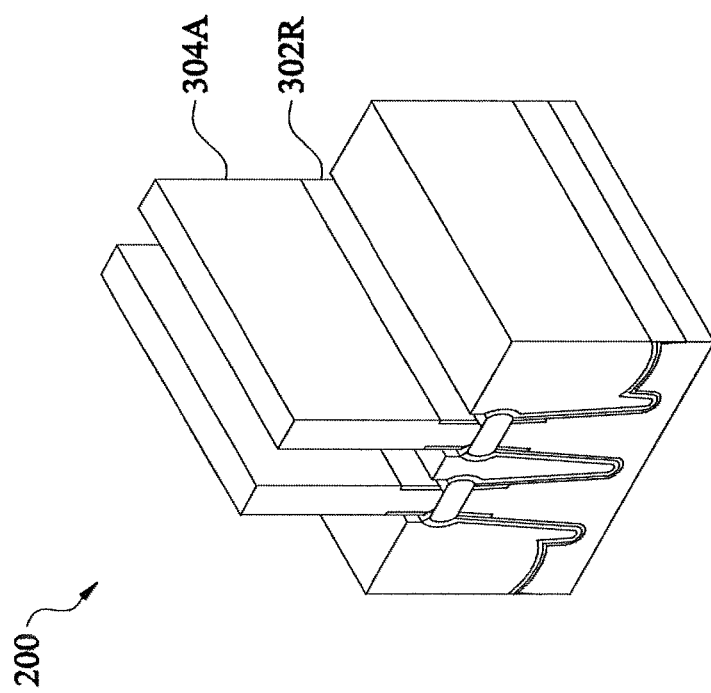
Figure 12B:
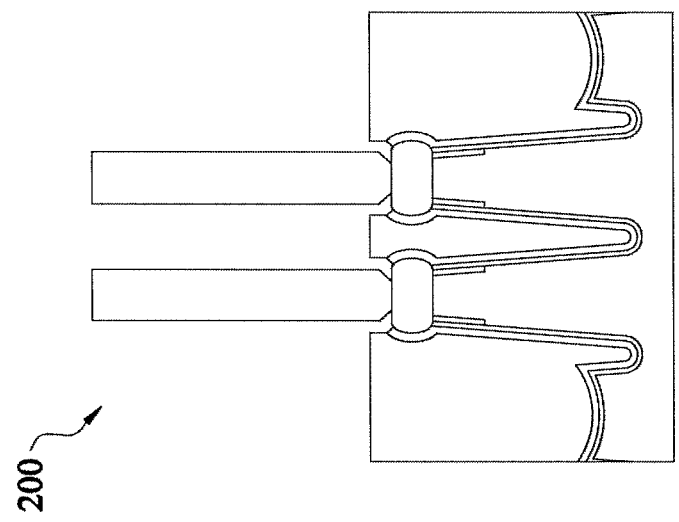
Figure 12A:
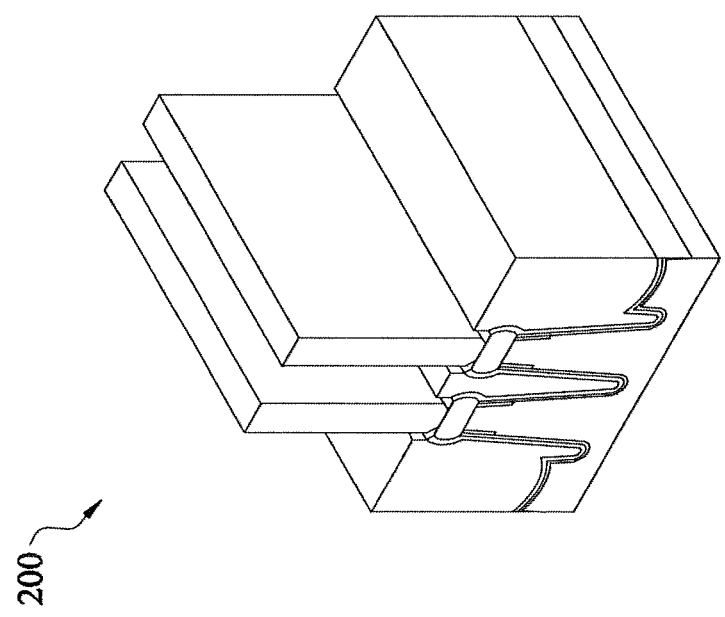
Figure 13B:
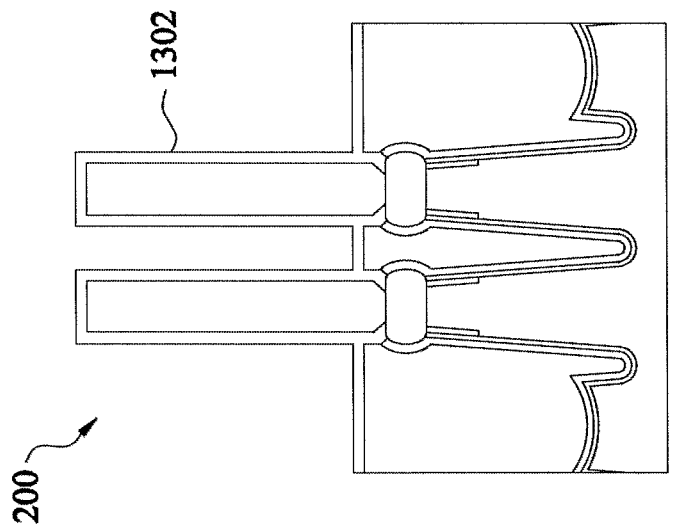
Figure 13A:
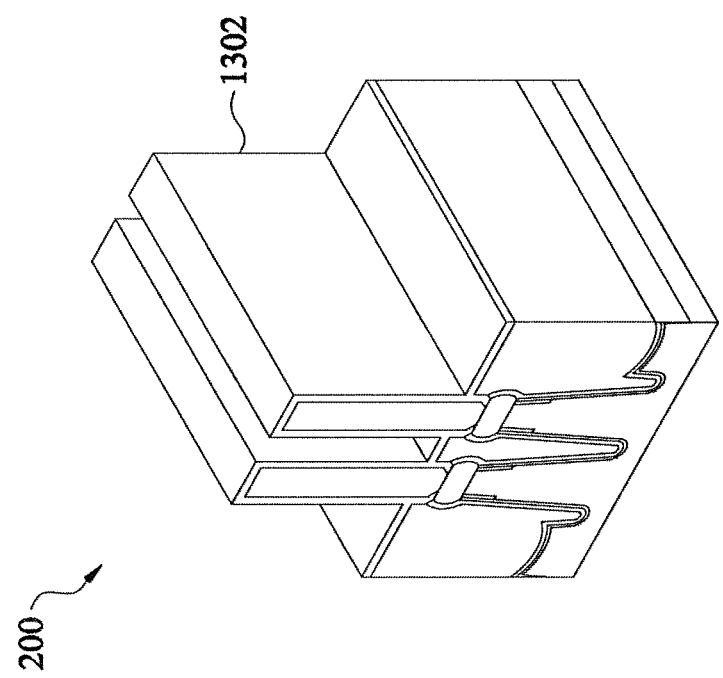

In some embodiments, a recessing depth is controlled (e.g., by controlling an etching time) so as to result in a desired height 'H' of the exposed upper portion 402A of the fin elements 402. As shown in FIG. 10B, each of the plurality of fins 402 include a height '$H_{FIN}$' and width '$W_{FIN}$', for example, defined at least in part during the formation of the fin elements at block 108. In some examples, the fin height '$H_{FIN}$' may be between approximately 30 nm-60 nm (e.g., as defined by the thickness of the epitaxial layer 304), and the fin width '$W_{FIN}$' may be between approximately 4 nm-10 nm (e.g., as defined during the fin formation process of block 108). In various embodiments, the recessing depth of the isolation regions 902 is controlled to ensure that a top surface 904 of the recessed isolation regions 902 is positioned along a horizontal plane disposed above a horizontal plane 402BP defined by a fin bottom surface 402B. In such embodiments therefore, the height 'H' of the exposed upper portion 402A of the fins 402 may be less than the fin height '$H_{FIN}$' (e.g., less than between approximately 30 nm-60 nm). In some embodiments, the recessing depth of the isolation regions 902 is controlled such that the top surface 904 of the recessed isolation regions 902 is positioned along a horizontal plane substantially co-planar with the horizontal plane 402BP defined by the fin bottom surface 402B. In such embodiments therefore, the height 'H' of the exposed upper portion 402A of the fins 402 may be substantially equal to the fin height '$H_{FIN}$' (e.g., substantially equal to between approximately 30 nm-60 nm). Thus, in general, the top surface 904 of the recessed isolation regions 902 may be either aligned with, or above, the plane 402BP defined by the fin bottom surface 402B. By controlling the height of the recessed isolation regions 902 as described herein, undesirable parasitic capacitances may be avoided. Moreover, reduction and/or avoidance of such parasitic capacitances avoids costly AC device performance penalties (e.g., due to increased RC delay times).

The method 100 then proceeds to block 122 where the liner layer is etched. Referring to the examples of FIGS. 10A/10B and 11A/11B, in an embodiment of block 122, the liner layer 702 is etched to expose the residual Ge of the residual material portion 302R within the second epitaxial layer portion 304A. In some embodiments, the process used to etch the liner layer 702 may include a wet etching process, a dry etching process, and/or a combination thereof. In some embodiments, the liner layer 702 may be etched using a wet etch performed using heated phosphoric acid ($H_3PO_3$). However, in some embodiments, other wet and/or dry etchants may be used to etch the liner layer 702 without departing from the scope of the present disclosure. Additionally, in some embodiments, the etching process (e.g., of the liner layer 702) may include an over-etching process, which may result in voids 1102 adjacent to the second epitaxial layer portion 304A that expose the residual Ge of the residual material portion 302R within the second epitaxial layer portion 304A. In some embodiments, the over-etching process may also expose at least portions of the fin bottom surface 402B. In some embodiments, the liner layer 702 may be over-etched by around 2 nm-6 nm. In some examples, the over-etching process may further include an etchant that etches the oxidized layer 302C, thereby exposing even more of the fin bottom surface 402B. In some cases, the oxidized layer 302C may be etched using the same etchant as that which is used to etch the liner layer 702. In some embodiments, the oxidized layer 302C may be etched using a different etchant than that which is used to etch the liner layer 702. In some examples, the etchant is a selective etchant that only etches the liner layer 702 without etching the oxidized layer 302C. Thus, after the liner layer 702 is etched, the residual Ge of the residual material portion 302R within the second epitaxial layer portion 304A is exposed and may be subsequently removed.

It is noted that in at least some existing solutions, in order to expose such residual Ge of the residual material portion 302R (e.g., within the second epitaxial layer portion 304A), the isolation regions 902 would have to be recessed such that the top surface 904 of the recessed isolation regions 902 would be below the plane 402BP defined by the fin bottom surface 402B (FIG. 10B). This would lead to an AC performance penalty for subsequently fabricated devices due to the introduction of additional parasitic capacitance, as discussed above. Alternatively, by formation of the liner layer 702 prior to formation of the isolation regions 902, embodiments of the present disclosure advantageously avoid such issues. In particular, as described above, embodiments of the present disclosure including the liner layer 702 ensure that the top surface 904 of the recessed isolation regions 902 remain either substantially aligned with, or above, the plane 402BP defined by the fin bottom surface 402B (avoiding costly AC performance penalties), while also providing for exposure of the residual Ge of the residual material portion 302R, which is at and/or adjacent to the fin bottom surface 402B, upon etching and/or over-etching of the liner layer 702.

The method 100 then proceeds to block 124 where the residual Ge is cleaned. Referring to the examples of FIGS. 11A/11B and 12A/12B, in an embodiment of block 124, the residual Ge exposed by the liner layer 702 etching process of block 122 may be removed. In some embodiments, the process used to clean the Ge residue may include a wet etching process, a dry etching process, and/or a combination thereof. In some embodiments, the exposed Ge residue may be cleaned (i.e., etched and or otherwise removed) using a wet etch performed using a mixture of sulfuric acid ($H_2SO_4$) and hydrogen peroxide ($H_2O_2$) (known as a sulfuric peroxide mixture (SPM)), a mixture of ammonium hydroxide ($NH_4OH$), $H_2O_2$, and water ($H_2O$) (known as an ammonia-peroxide mixture (APM)), a mixture of $NH_4OH$ and $H_2O_2$, $H_2O_2$, and/or other etchants as known in the art. Additionally, in some embodiments and at least in part due to the over-etching performed at block 122, residual Ge may be removed from the residual material portion 302R as well as from at least part of the fin bottom surface 402B. Thus, cleaning the residual Ge, in accordance with the embodiments described herein, improves performance of subsequently fabricated FinFET devices.

The method 100 then proceeds to block 126 where a dummy gate stack is formed. With reference first to the example of FIGS. 13A/13B, in an embodiment of block 126, a dielectric layer 1302 may be formed. In some embodiments, the dielectric layer 1302 is deposited over the substrate 202 and over the fins 402, including within trenches between adjacent fins 402. In some embodiments, the dielectric layer 1302 may include $SiO_2$, silicon nitride, a high-K dielectric material or other suitable material. In various examples, the dielectric layer 1302 may be deposited by a CVD process, a subatmospheric CVD (SACVD) process, a flowable CVD process, an ALD process, a PVD process, or other suitable process. By way of example, the dielectric layer 1302 may be used to prevent damage to the fin elements 402 by subsequent processing (e.g., subsequent formation of the dummy gate stack).

Figure 14:
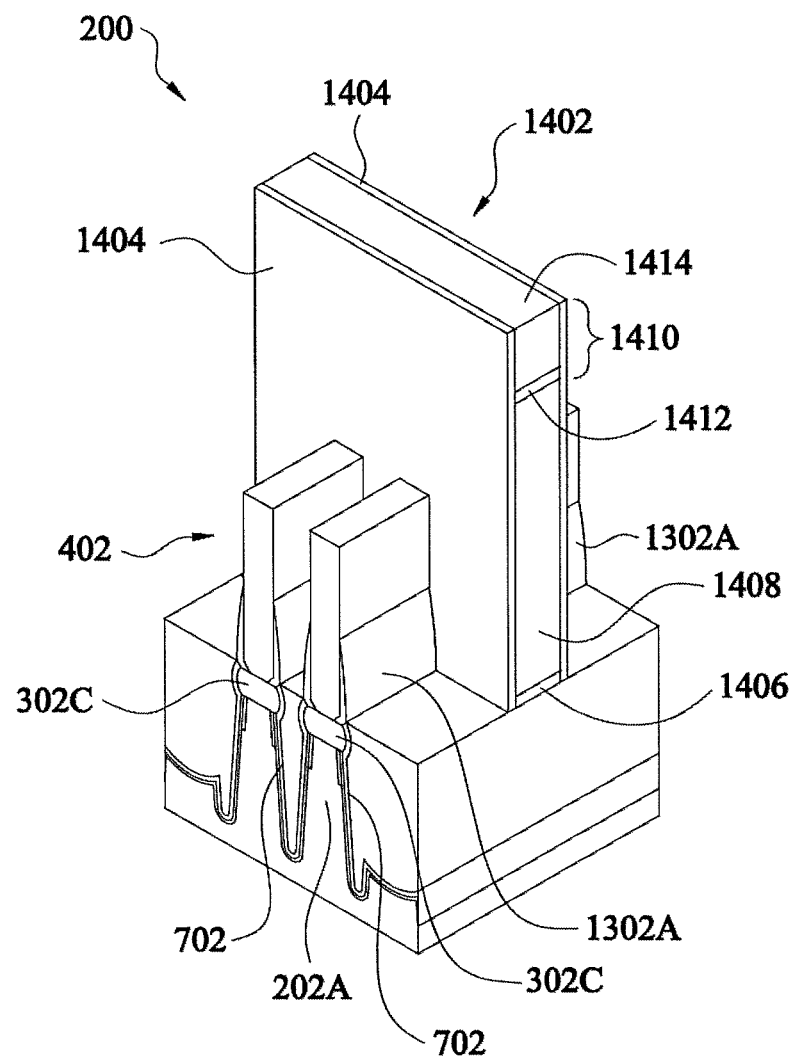
Figure 15:
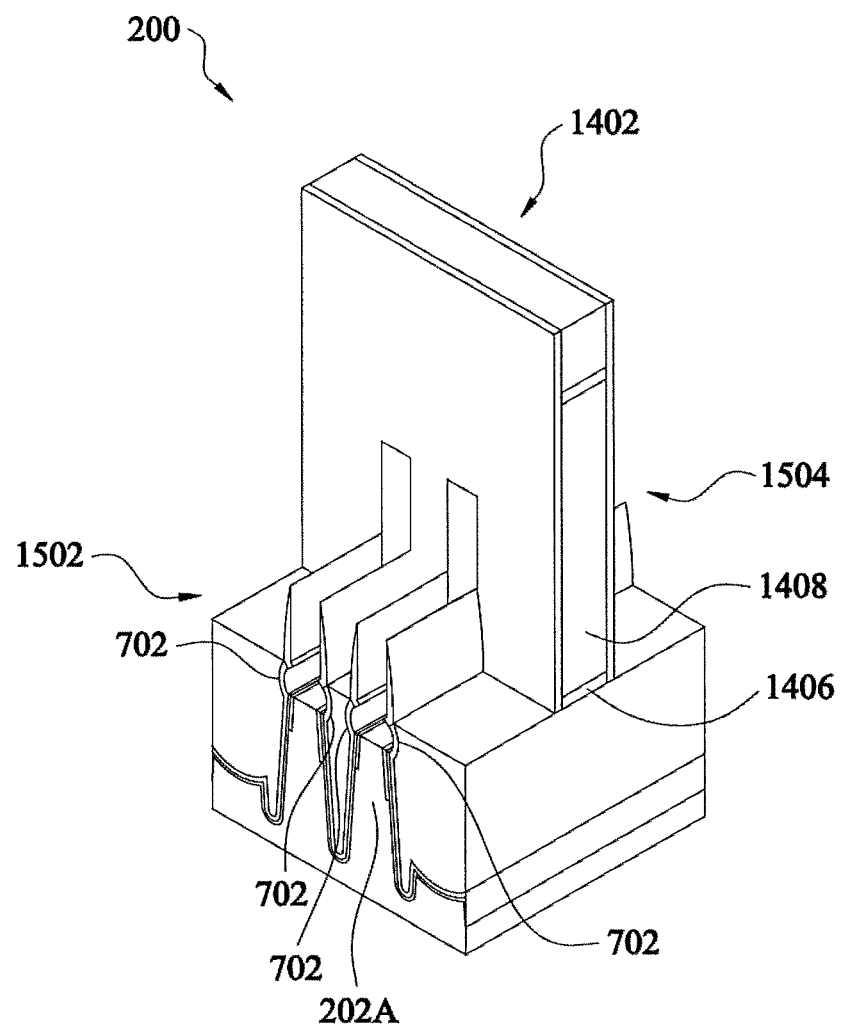
Figure 16:
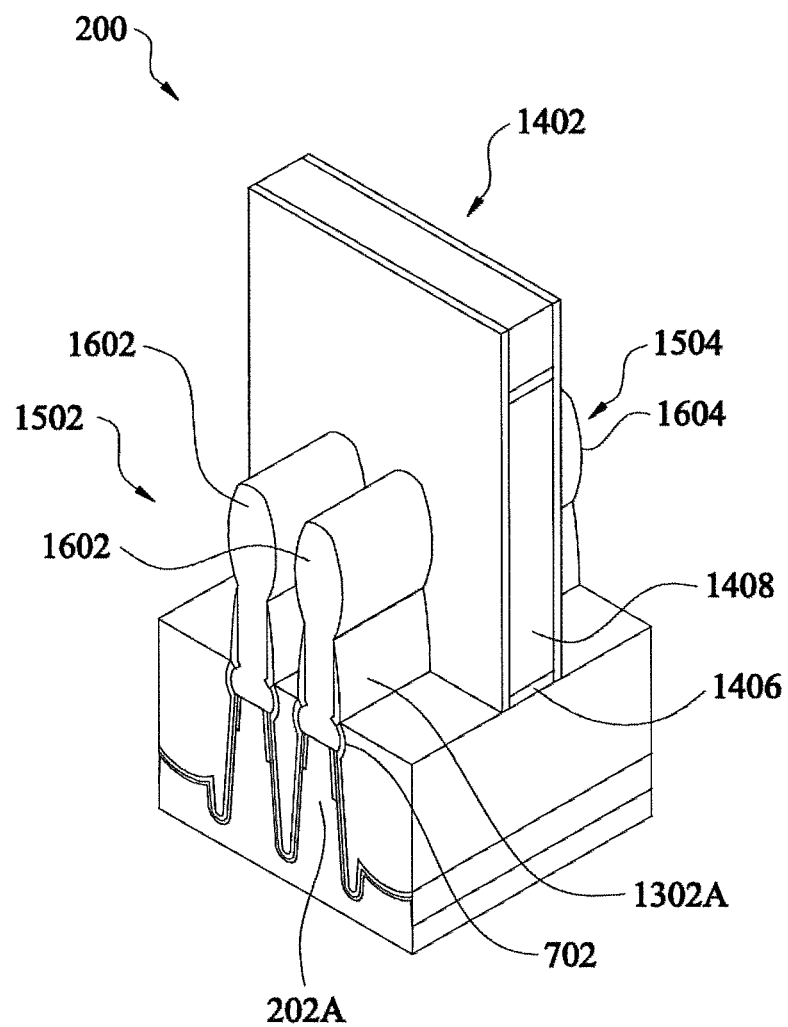
Figure 17:
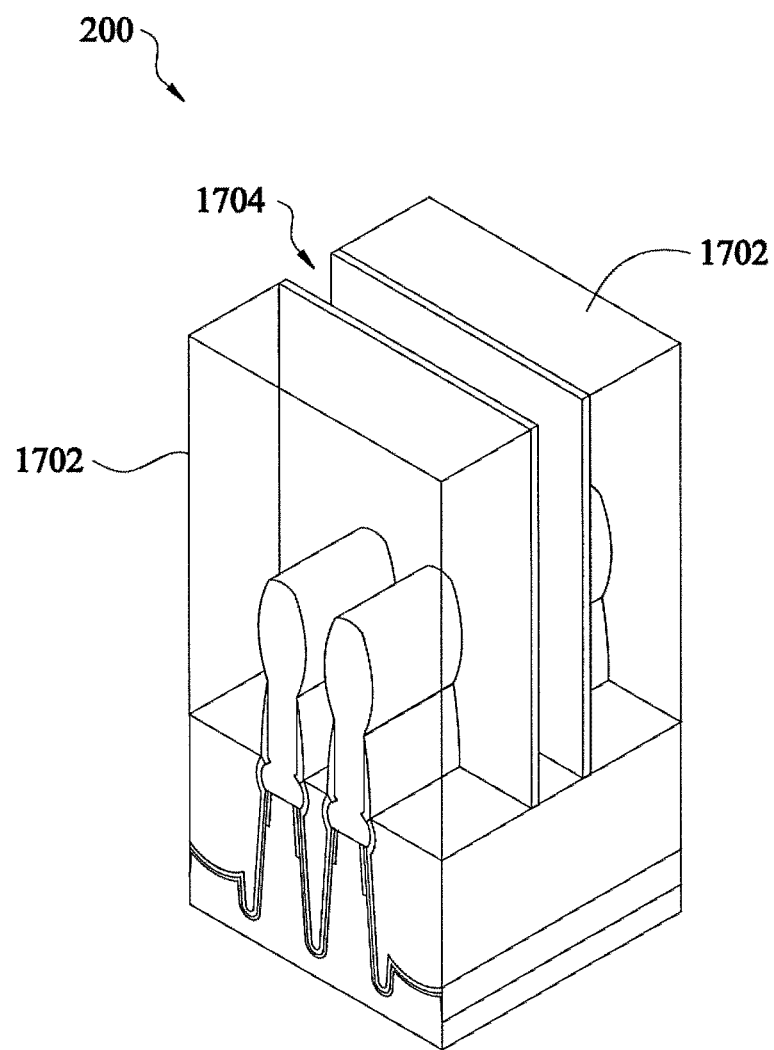
Figure 18:
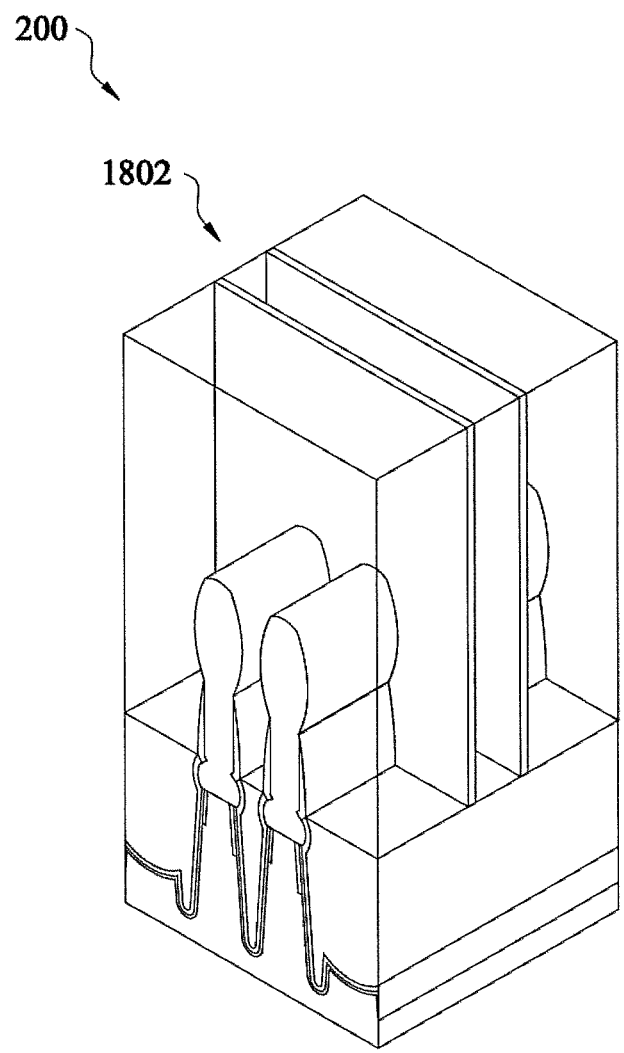

Referring now to the example of FIG. 14, in a further embodiment of block 126, processing of the dummy gate stack continues. For example, in some embodiments, a gate stack 1402 and sidewall spacers 1404 disposed on sidewalls of the gate stack 1402 are formed. In an embodiment, the gate stack 1402 is a dummy gate stack. However, in some embodiments of the method 100, the gate stack 1402 may be a high-K/metal gate stack. While the method 100 is described below with reference to a replacement gate process, those skilled in the art will readily appreciate that the methods and structures disclosed herein may equally apply to a gate-first process. In some examples, a gate-first process includes formation of a gate stack prior to source/drain formation or source/drain dopant activation. Merely by way of example, a gate-first process may include gate dielectric and metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation.

In some embodiments using a gate-last process, the gate stack 1402 is a dummy gate stack and will be replaced by the final gate stack at a subsequent processing stage of the device 200. In particular, the gate stack 1402 may be replaced at a later processing stage by a high-K dielectric layer (HK) and metal gate electrode (MG). In some embodiments, the gate stack 1402 is formed over the substrate 202 and is at least partially disposed over the fin elements 402. Additionally, in various embodiments, the gate stack 1402 is formed over the dielectric layer 1302, which was deposited as described above prior to formation of the gate stack 1402. In some embodiments, the gate stack 1402 includes a dielectric layer 1406, an electrode layer 1408, and a hard mask 1410 which may include an oxide layer 1412 and a nitride layer 1414 formed over the oxide layer 1412. In some embodiments, the gate stack 1402 is formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 1406 of the gate stack 1402 includes silicon oxide. Alternatively or additionally, the dielectric layer 1406 of the gate stack 1402 may include silicon nitride, a high-K dielectric material or other suitable material. In some embodiments, the electrode layer 1408 of the gate stack 1402 may include polycrystalline silicon (polysilicon). In some embodiments, the oxide layer 1412 of the hard mask 1410 includes a pad oxide layer that may include $SiO_2$. In some embodiments, the nitride layer 1414 of the hard mask 1410 includes a pad nitride layer that may include $Si_3N_4$, silicon oxynitride or silicon carbide.

In various embodiments, the sidewall spacers 1404 are disposed on the sidewalls of the gate stack 1402. The sidewall spacers 1404 may include a dielectric material such as silicon oxide, silicon nitride, silicon carbide, silicon oxynitride, or combinations thereof. In some embodiments, the sidewall spacers 1404 include multiple layers, such as main spacer walls, liner layers, and the like. By way of example, the sidewall spacers 1404 may be formed by depositing a dielectric material over the gate stack 1402 and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers 1404, an ion implantation process may be performed to form lightly-doped drain (LDD) features within the semiconductor device 200. In other embodiments, such LDD features may be formed by epitaxial growth of an in-situ doped layer prior to forming the sidewall spacers 1404. In some embodiments, a plasma doping (PLAD) process may be used to form the LDD features. In yet other embodiments, an ion implantation process may be performed after forming the sidewall spacers 1404 to form the LDD features. In some embodiments, after formation of the LDD features, the semiconductor device 200 may be subject to a high thermal budget process (anneal) to remove defects and activate dopants (i.e., to place dopants into substitutional sites). It should be noted that in accordance with various embodiments, any potential diffusion of APT dopants previously implanted and disposed within the substrate regions 202A (e.g., due to high thermal budget processing), will be blocked from diffusing into the FinFET channel regions (i.e., the second epitaxial layer portion 304A) by the fully oxidized layer 302C.

In some embodiments, still with reference to the example of FIG. 14, after formation of the dummy gate stack (e.g., the gate stack 1402), the dielectric layer 1302 may be etched-back to form dielectric regions 1302A and thereby expose portions of the fin elements 402 not covered by the gate stack 1402. In some embodiments, etching-back of the dielectric layer 1302 may include a wet etch process, a dry etch process, a multiple-step etch process, and/or a combination thereof. Thus, preserving the dielectric layer 1302 during formation of the gate stack 1402 serves to effectively protect the fin elements 402 during such processing.

The method 100 then proceeds to block 128 where the fin elements are etched. Referring to the example of FIGS. 14 and 15, in an embodiment of block 128, portions of the fin elements 402 on either side of the gate stack 1402 (exposed by formation of the dielectric regions 1302A) may be etched. The etched portions of the fin elements 402 may include portions of the fin elements 402 within source/drain regions 1502, 1504 on either side of the gate stack 1402. In some embodiments, the etching of the portions of the fin elements 402 may be performed using a dry etching process, a wet etching process, and/or a combination thereof. Additionally, in some embodiments, portions of the oxide regions beneath the etched portions of the fin elements 402, which may include oxide layer 302C (e.g., bordered by the liner layer 702), are also etched. In some embodiments, etching the oxide regions beneath the etched portions of the fin elements 402 exposes the underlying substrate regions 202A. In various embodiments, the etching of the oxide regions (e.g., the oxide layer 302C) beneath the etched portions of the fin elements 402 may be performed using a dry etching process, a wet etching process, and/or a combination thereof. It is noted that in the embodiments disclosed herein, the oxide layer 302C remains present beneath the gate stack 1402, serving to block diffusion of APT dopants from within the substrate regions 202A into the device channel region (i.e., the second epitaxial layer portion 304A covered by the gate stack 1402).

The method 100 then proceeds to block 130 where source/drain features are formed. Referring to the example of FIGS. 15 and 16, in an embodiment of block 130, source/drain features 1602, 1604 are formed in source/drain regions 1502, 1504. In some embodiments, the source/drain features 1602, 1604 are formed by epitaxially growing a semiconductor material layer in the source/drain regions 1502, 1504. In some examples, dummy sidewall spacers may be formed prior to epitaxial source/drain growth and removed after epitaxial source/drain growth. Additionally, in some embodiments, the main sidewall spacers may be formed, as described above, after epitaxial source/drain growth. In various embodiments, the semiconductor material layer grown in the source/drain regions 1502, 1504 may include Ge, Si, GaAs, AlGaAs, SiGe, GaAsP, SiP, or other suitable material. The source/drain features 1602, 1604 may be formed by one or more epitaxial (epi) processes. In some embodiments, the source/drain features 1602, 1604 may be in-situ doped during the epi process. For example, in some embodiments, epitaxially grown SiGe source/drain features 1602, 1604 may be doped with boron. In some embodiments, epitaxially grown Si epi source/drain features 1602, 1604 may be doped with carbon to form Si:C source/drain features, phosphorous to form Si:P source/drain features, or both carbon and phosphorous to form SiCP source/drain features. In some embodiments, the source/drain features 1602, 1604 are not in-situ doped, and instead an implantation process is performed to dope the source/drain features 1602, 1604. In various embodiments, a doping dose used to dope the source/drain features 1602, 1604 is greater than a doping dose used to dope the LDD features. In some embodiments, formation of the source/drain features 1602, 1604 may be performed in separate processing sequences for each of N-type and P-type source/drain features 1602, 1604. In some embodiments, after formation of the source/drain features 1602, 1604, an epi anneal process may be performed, where the semiconductor device 200 is subjected to a high thermal budget process. However, as described above, the oxide layer (e.g., the oxide layer 302C) which remains present beneath the gate stack 1402, will block any potential diffusion of APT dopants from within the substrate regions 202A into the device channel region (i.e., the second epitaxial layer portion 304A covered by the gate stack 1402) during such high thermal budget processing.

The method 100 then proceeds to block 132 where an inter-layer dielectric (ILD) layer is formed and the dummy gate stack is removed. Referring to the example of FIGS. 16 and 17, in an embodiment of block 132, an ILD layer 1702 is formed over the substrate 202. In some embodiments, a contact etch stop layer (CESL) is formed over the substrate 202 prior to forming the ILD layer 1702. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 1702 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1702 may be deposited by a PECVD process or other suitable deposition technique. In some embodiments, after formation of the ILD layer 1702, the semiconductor device 200 may be subject to a high thermal budget process to anneal the ILD layer. As described above, the oxide layer (e.g., the oxide layer 302C) blocks any potential diffusion of APT dopants from within the substrate regions 202A into the device channel region during such high thermal budget processing. In some examples, a planarization process may be performed to expose a top surface of the dummy gate stack 1402. For example, a planarization process includes a chemical mechanical planarization (CMP) process which removes portions of the ILD layer 1702 (and CESL layer, if present) overlying the dummy gate stack 1402 and planarizes a top surface of the semiconductor device 200. In addition, the CMP process may remove the hard mask 1410 overlying the dummy gate stack 1402 to expose the electrode layer 1408, such as a polysilicon electrode layer. Thereafter, in some embodiments, the remaining previously formed dummy gate stack 1402 features (e.g., the dielectric layer 1406 and the electrode layer 1408) may be removed from the substrate. In some embodiments, the electrode layer 1408 may be removed while the dielectric layer 1406 is not removed. The removal of the electrode layer 1408 (or the electrode layer 1408 and dielectric layer 1406) from the gate stack 1402 may result in a trench 1704, and a final gate structure (e.g., including a high-K dielectric layer and metal gate electrode) may be subsequently formed in the trench 1704, as described below. The removal of the dummy gate stack features may be performed using a selective etch process such as a selective wet etch, a selective dry etch, or a combination thereof.

The method 100 then proceeds to block 134 where a high-K/metal gate stack is formed. Referring to the example of FIGS. 17 and 18, in an embodiment of block 134, a high-K/metal gate stack 1802 is formed within the trench 1704 of the device 200. In various embodiments, the high-K/metal gate stack includes an interfacial layer formed over the substantially dopant-free channel material of the fin (i.e., the second epitaxial layer portion 304A), a high-K gate dielectric layer formed over the interfacial layer, and a metal layer formed over the high-K gate dielectric layer. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the high-K/metal gate stack 1802 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the high-K/metal gate stack 1802 may include a high-K dielectric layer such as hafnium oxide ($HfO_2$). Alternatively, the gate dielectric layer of the high-K/metal gate stack 1802 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The high-K gate dielectric layer may be formed by ALD, physical vapor deposition (PVD), CVD, oxidation, and/or other suitable methods. The metal layer of the high-K/metal gate stack 1802 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer of the high-K/metal gate stack 1802 may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof. In addition, the metal layer may provide an N-type or P-type work function, may serve as a transistor (e.g., FinFET) gate electrode, and in at least some embodiments, the metal layer of the high-K/metal gate stack 1802 may include a polysilicon layer. In various embodiments, the metal layer of the high-K/metal gate stack 1802 may be formed by ALD, PVD, CVD, e-beam evaporation, or other suitable process. Further, the metal layer of the high-K/metal gate stack 1802 may be formed separately for N-FET and P-FET transistors which may use different metal layers. In various embodiments, a CMP process may be performed to remove excessive metal from the metal layer of the high-K/metal gate stack 1802, and thereby provide a substantially planar top surface of the metal layer of the high-K/metal gate stack 1802.

The semiconductor device 200 may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 100, and some process steps described above may be replaced or eliminated in accordance with various embodiments of the method 100.

With respect to the description provided herein, the present disclosure offers methods and structures for avoiding degradation to semiconductor devices that can occur due to ion implantation processes, including defect formation and the introduction of channel impurities (i.e., unwanted channel dopants). In some examples, one or more APT ion implantation processes is performed prior to formation of FinFET fin elements. In some embodiments, an epitaxially grown undoped channel layer is formed over the APT-implanted substrate. Moreover, in various embodiments, the epitaxially grown undoped channel layer is separated from the APT-implanted substrate by a dielectric layer, which serves as a barrier to APT dopants. Because of this advantageous oxide barrier layer, the APT implant may have a high dopant concentration, for example, of between about $1 \times 10^{18}$ cm$^{-3}$ and $1 \times 10^{19}$ cm$^{-3}$. In some embodiments, because the epitaxially grown undoped channel layer is substantially free of dopants, carrier channel scattering is mitigated, and device mobility and drive current are improved. Embodiments of the present disclosure also provide methods for fully oxidizing a SiGe layer which subsequently serves as an oxide barrier layer (e.g., by trimming the SiGe layer prior to oxidation), as well as reducing and/or eliminating Ge residue (e.g., by inserting a silicon nitride liner layer prior to formation of isolation regions) without a penalty on a FinFET height or width. The present disclosure further ensures that a top surface of a recessed isolation region remains either substantially aligned with, or above, a plane defined by a fin bottom surface (e.g., above the oxide barrier layer), thus avoiding costly AC performance penalties. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device (e.g., a FinFET device) having a substantially undoped channel region. In some embodiments, the method includes forming a plurality of fins extending from a substrate. In various embodiments, each of the plurality of fins includes a portion of a substrate, a portion of a first epitaxial layer on the portion of the substrate, and a portion of a second epitaxial layer on the portion of the first epitaxial layer. By way of example, the portion of the first epitaxial layer of each of the plurality of fins is oxidized. In some embodiments, after oxidizing the portion of the first epitaxial layer, a liner layer is formed over each of the plurality of fins. In various examples, recessed isolation regions are then formed adjacent to the liner layer. Thereafter, the liner layer may be etched to expose a residual material portion (e.g., Ge residue) adjacent to a bottom surface of the portion of the second epitaxial layer of each of the plurality of fins, and the residual material portion is removed.

In another of the embodiments, discussed is a method including depositing a first epitaxial layer over a substrate and a second epitaxial layer over the first epitaxial layer. In some embodiments, a plurality of fins is formed extending from the substrate. In various examples, each of the plurality of fins includes a substrate portion, a first epitaxial layer portion over the substrate portion, and a second epitaxial layer portion over the first epitaxial layer portion. The second epitaxial layer portion has a height. In some examples, a liner layer is deposited over each of the plurality of fins. An isolation region may be formed adjacent to and in contact with the liner layer. In some embodiments, the liner layer is etched to expose a residual material portion adjacent to a bottom surface of the second epitaxial layer portion, and the residual layer portion is cleaned. In some cases, prior to etching the liner layer, the isolation region is recessed by an amount less than the height of the second epitaxial layer portion.

In yet another of the embodiments, discussed is a semiconductor device including a plurality of fin elements extending from a substrate. In some examples, each of the plurality of fin elements includes a first semiconductor layer, a dielectric layer over the first semiconductor layer, and a second semiconductor layer over the dielectric layer. By way of example, the second semiconductor layer includes a bottom surface that defines a first horizontal plane. In various embodiments, the semiconductor device further includes a recessed isolation region adjacent to the plurality of fin elements, where the recessed isolation region includes a top surface adjacent to the second semiconductor layer, where the top surface defines a second horizontal plane, and where the second horizontal plane is disposed above the first horizontal plane. In addition, the semiconductor device may include a gate stack formed over the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a fin element including a first semiconductor layer disposed beneath and separated from a second semiconductor layer by a dielectric layer, wherein the second semiconductor layer includes a bottom surface that defines a first horizontal plane; and
    an isolation region adjacent to the fin element, wherein a top surface of the isolation region defines a second horizontal plane;
    wherein the first and second horizontal planes are co-planar.

2. The semiconductor device of claim 1, further including a liner layer adjacent to and in contact with the first semiconductor layer.

3. The semiconductor device of claim 1, wherein the first semiconductor layer includes Si, the dielectric layer includes oxidized SiGe, and the second semiconductor layer includes Si.

4. The semiconductor device of claim 1, wherein the isolation region includes a first dielectric material, wherein the first dielectric material includes a void interposing the bottom surface of the second semiconductor layer and the isolation region, and wherein a second dielectric material is disposed within the void.

5. A semiconductor device, comprising:
    a gate stack disposed over a fin, wherein beneath the gate stack the fin includes a semiconductor channel region formed on an oxidized SiGe diffusion barrier, wherein the semiconductor channel region has a bottom surface that defines a first horizontal plane; and
    a shallow trench isolation (STI) region adjacent to the fin, wherein a top surface of the STI region defines a second horizontal plane that is disposed level with or above the first horizontal plane.

6. The semiconductor device of claim 5, wherein the semiconductor channel region includes an undoped semiconductor layer.

7. The semiconductor device of claim 5, wherein the fin further includes an ion-implanted semiconductor layer, and wherein the oxidized SiGe diffusion barrier is formed on the ion-implanted semiconductor layer.

8. The semiconductor device of claim 5, wherein the oxidized SiGe diffusion barrier is laterally adjacent to, and in contact with, a bottom portion of source/drain features disposed on opposing sides of the gate stack.

9. The semiconductor device of claim 7, further including a liner layer adjacent to and in contact with the ion-implanted semiconductor layer.

10. The semiconductor device of claim 9, wherein the ion-implanted semiconductor layer includes Si, the semiconductor channel region includes Si, and the liner layer includes silicon nitride.

11. The semiconductor device of claim 5, wherein the STI region includes a first dielectric material, wherein the first dielectric material includes a void interposing the bottom surface of the semiconductor channel region and the STI region, and wherein a second dielectric material is disposed within the void.

12. The semiconductor device of claim 7, wherein the ion-implanted semiconductor layer includes an N-type anti-punch through (APT) dopant or a P-type APT dopant.

13. The semiconductor device of claim 7, wherein the ion-implanted semiconductor layer includes residual Ge disposed on opposing sidewalls of a top portion of the ion-implanted semiconductor layer.

14. The semiconductor device of claim 12, wherein a concentration of the N-type APT dopant or the P-type APT dopant is between about $1\times10^{18}$ cm$^{-3}$ and $1\times10^{19}$ cm$^{-3}$.

15. A semiconductor device, comprising:
    a fin element including an undoped semiconductor layer disposed over an oxidized layer, wherein a height of the undoped semiconductor layer is defined as a first distance between top and bottom surfaces of the undoped semiconductor layer; and
    a dielectric region adjacent to the fin element, wherein the dielectric region is recessed by a second distance measured from a first plane defined by the top surface of the undoped semiconductor layer to a second plane defined by a top surface of the dielectric region, and wherein the second distance is less than or equal to the first distance.

16. The semiconductor device of claim 15, wherein a third plane defined by a bottom surface of the undoped semiconductor layer is substantially co-planar with the second plane.

17. The semiconductor device of claim 15, wherein a third plane defined by a bottom surface of the undoped semiconductor layer is disposed below the second plane.

18. The semiconductor device of claim 16, wherein the second distance is equal to the first distance.

19. The semiconductor device of claim 17, wherein the second distance is less than the first distance.

20. The semiconductor device of claim 15, wherein the height of the undoped semiconductor layer is between about 30-60 nm.

* * * * *